(12) United States Patent
Loh et al.

(10) Patent No.: US 11,031,286 B2
(45) Date of Patent: Jun. 8, 2021

(54) CONDUCTIVE FEATURE FORMATION AND STRUCTURE

(71) Applicant: Taiwan Semiconductor Manufacturing Co., Ltd., Hsinchu (TW)

(72) Inventors: Wei-Yip Loh, Hsinchu (TW);
Chih-Wei Chang, Chu-Dong (TW);
Hong-Mao Lee, Hsinchu (TW);
Chun-Hsien Huang, Hsinchu (TW);
Yu-Ming Huang, Tainan (TW);
Yan-Ming Tsai, Toufen (TW);
Yu-Shiuan Wang, Taipei (TW);
Hung-Hsu Chen, Hsinchu (TW);
Yu-Kai Chen, Taipei (TW); Yu-Wen Cheng, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 129 days.

(21) Appl. No.: 15/909,762

(22) Filed: Mar. 1, 2018

(65) Prior Publication Data

US 2019/0273023 A1 Sep. 5, 2019

(51) Int. Cl.
*H01L 21/768* (2006.01)
*H01L 21/8234* (2006.01)
(Continued)

(52) U.S. Cl.
CPC .. *H01L 21/76856* (2013.01); *H01L 21/76805* (2013.01); *H01L 21/823425* (2013.01);
(Continued)

(58) Field of Classification Search
CPC .... H01L 21/768; H01L 29/08; H01L 21/8234
See application file for complete search history.

(56) References Cited

U.S. PATENT DOCUMENTS

| 6,399,512 | B1* | 6/2002 | Blosse | H01L 21/76897 438/723 |
| 8,039,391 | B1* | 10/2011 | Yin | H01L 21/28518 438/656 |

(Continued)

FOREIGN PATENT DOCUMENTS

| CN | 105304556 A | 2/2016 |
| CN | 106971939 A | 7/2017 |

(Continued)

*Primary Examiner* — Marcos D. Pizarro
*Assistant Examiner* — Quinton A Brasfield
(74) *Attorney, Agent, or Firm* — Slater Matsil, LLP

(57) ABSTRACT

Generally, examples are provided relating to conductive features that include a barrier layer, and to methods thereof. In an embodiment, a metal layer is deposited in an opening through a dielectric layer(s) to a source/drain region. The metal layer is along the source/drain region and along a sidewall of the dielectric layer(s) that at least partially defines the opening. The metal layer is nitrided, which includes performing a multiple plasma process that includes at least one directional-dependent plasma process. A portion of the metal layer remains un-nitrided by the multiple plasma process. A silicide region is formed, which includes reacting the un-nitrided portion of the metal layer with a portion of the source/drain region. A conductive material is disposed in the opening on the nitrided portions of the metal layer.

20 Claims, 15 Drawing Sheets

(51) Int. Cl.
*H01L 29/08* (2006.01)
*H01L 23/522* (2006.01)
*H01L 29/417* (2006.01)
*H01L 29/66* (2006.01)
H01L 29/78 (2006.01)
H01L 21/285 (2006.01)

(52) U.S. Cl.
CPC .. *H01L 21/823475* (2013.01); *H01L 23/5226* (2013.01); *H01L 29/0847* (2013.01); *H01L 29/41791* (2013.01); *H01L 29/66795* (2013.01); *H01L 21/28518* (2013.01); *H01L 29/785* (2013.01)

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,331,159 B1 | 5/2016 | Jha et al. | |
| 9,396,995 B1 | 7/2016 | Patil et al. | |
| 9,406,804 B2 | 8/2016 | Huang et al. | |
| 9,443,769 B2* | 9/2016 | Wang | H01L 21/823481 |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2006/0046454 A1* | 3/2006 | Collins | H01L 21/76879 438/597 |
| 2006/0154481 A1* | 7/2006 | Wu | H01L 21/76888 438/683 |
| 2014/0273365 A1 | 9/2014 | Wei et al. | |
| 2016/0005824 A1 | 1/2016 | Lin et al. | |
| 2017/0207095 A1 | 7/2017 | Lee et al. | |
| 2019/0164822 A1* | 5/2019 | Chou | H01L 23/5226 |

FOREIGN PATENT DOCUMENTS

| | | |
|---|---|---|
| TW | 201603187 A | 1/2016 |
| TW | 201725615 A | 7/2017 |

\* cited by examiner

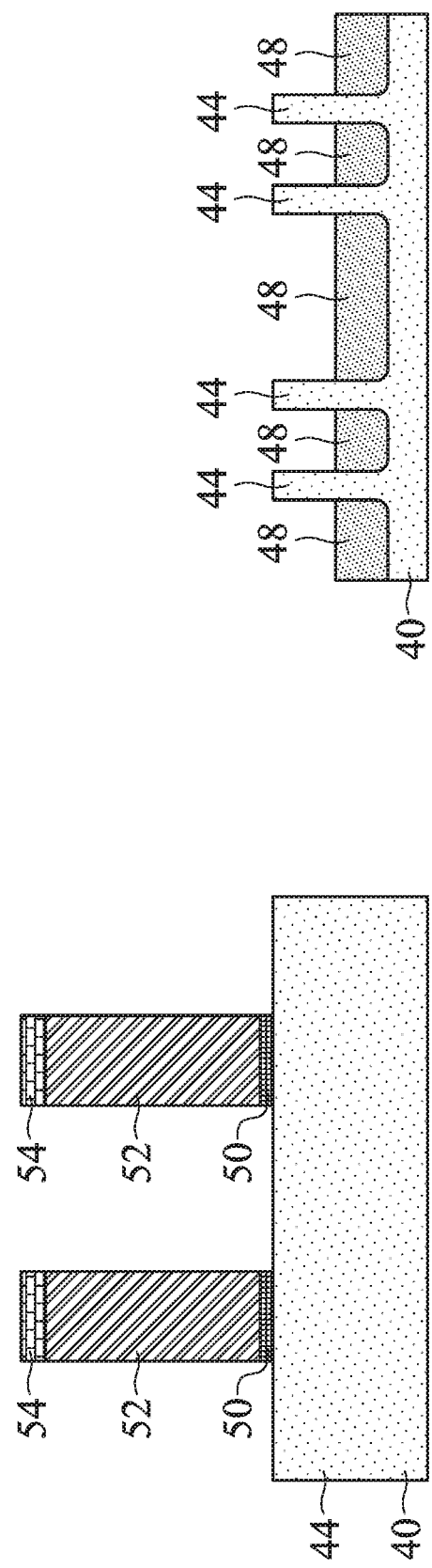

CONDUCTIVE FEATURE FORMATION AND STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-B, 3A-B, 4A-B, 5A-B, 6A-B, 7A-B, 8A-B, 9A-B, and 10A-B are cross-sectional views of respective intermediate structures at intermediate stages in an example process of forming FinFETs in accordance with some embodiments.

DETAILED DESCRIPTION

Figure 1:
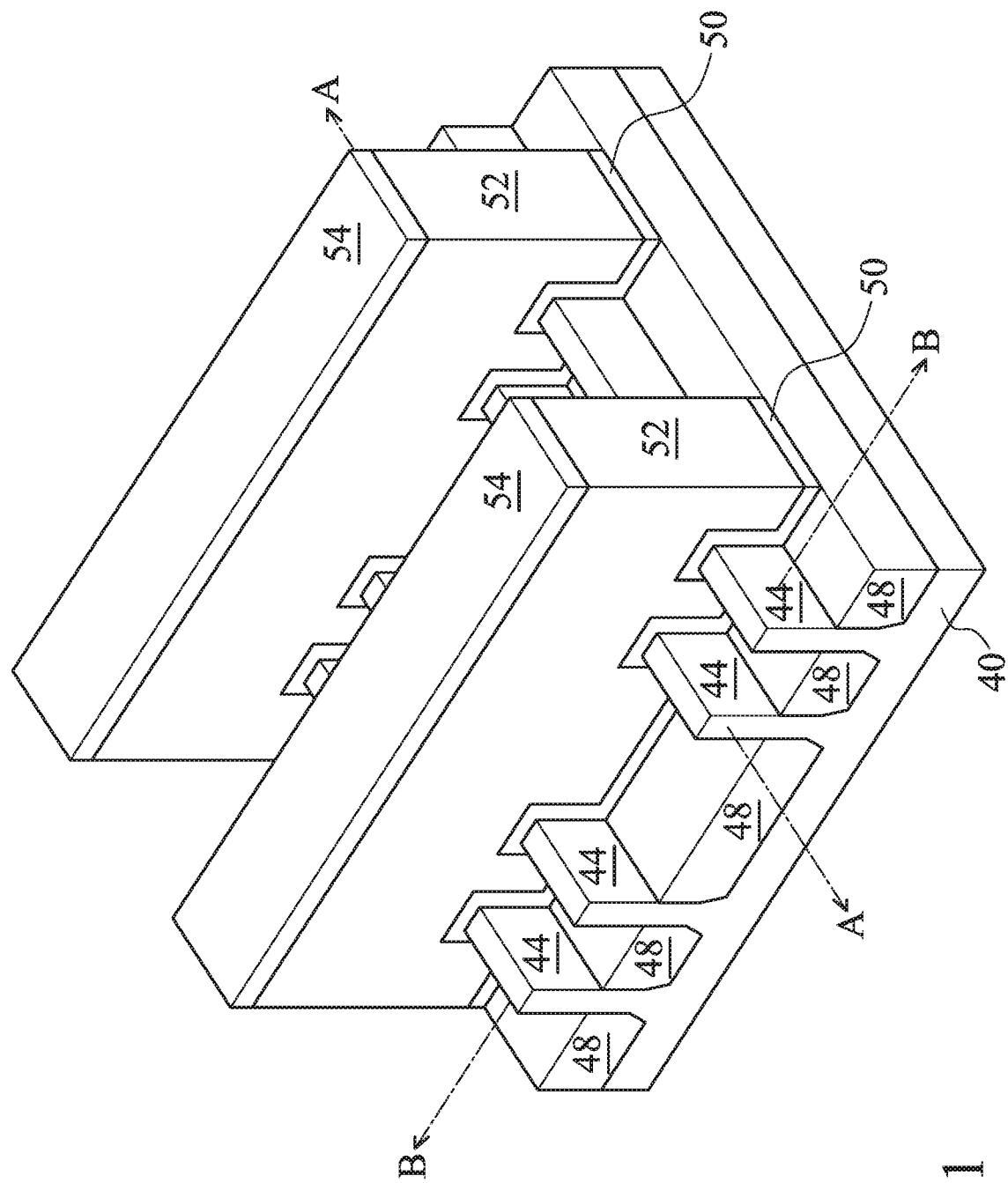
FIG. 1 is a three-dimensional view of an intermediate structure at an intermediate stage in an example process for forming Fin Field Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features that include a barrier layer, and to methods for forming those conductive features. In some examples, a metal layer is deposited in an opening to, e.g., a source/drain region using a directional deposition process. Multiple plasma processes may be used to nitride some of the metal layer to form a barrier layer. The multiple plasma processes may include plasma processes having various directional-dependencies. A remaining portion of the metal layer may then be reacted with the source/drain region to form a silicide region. A silicide region can thereby be formed with a greater surface area and thickness uniformity, and a barrier layer can be created with good adhesion characteristics and good oxygen diffusion prevention characteristics. Other benefits can be achieved.

Example embodiments described herein are described in the context of forming conductive features to source/drain regions of a Fin Field Effect Transistor (FinFET) in Front End Of the Line (FEOL) processing. Other embodiments may be implemented in other contexts, such as with different devices, such as planar Field Effect Transistors (FETs), Vertical Gate All Around (VGAA) FETs, Horizontal Gate All Around (HGAA) FETs, bipolar junction transistors (BJTs), diodes, etc. Aspects of the present disclosure may be implemented in any context where a conductive feature with a barrier layer is formed to a semiconductor region, where a silicide region is form on the semiconductor region. Aspects of the present disclosure may further be implemented in contexts where a barrier layer is to be formed and a silicide region is not formed, such as in a replacement gate process and/or in Back End Of the Line (BEOL) processing. Implementations of some aspects of the present disclosure may be used in other processes and/or in other devices.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1 through 10A-B illustrate views of respective intermediate structures at respective stages during an example process for forming Fin Field Effect Transistors (FinFETs) in accordance with some embodiments. FIG. 1 illustrates a perspective view of an intermediate structure at a stage of the example method. The intermediate structure, as described in the following, is used in the implementation of FinFETs. Other structures may be implemented in other example embodiments.

The intermediate structure includes fins 44 formed on a semiconductor substrate 40, with respective isolation regions 48 on the semiconductor substrate 40 between neighboring fins 44. Dummy gate stacks are along respective sidewalls of and over the fins 44. The dummy gate stacks each include an interfacial dielectric 50, a dummy gate 52, and a mask 54.

The semiconductor substrate 40 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 40 may include an elemental semiconductor such as silicon (Si) or germanium (Ge); a compound semiconductor; an alloy semiconductor; or a combination thereof The fins 44 are formed on the semiconductor substrate 40, such as by etching trenches in the semiconductor substrate 40 to form the fins 44. The isolation regions 48 are formed with each being in a corresponding trench between neighboring fins 44. The isolation regions 48 may include or be an insulating material such as an oxide (such as silicon oxide), a nitride, the like, or a combination thereof. The insulating material may be deposited in the trenches, planarized to the top surfaces of the fins 44, and recessed such that the fins 44 protrude from between the remaining insulating material, which forms the isolation regions 48. Other processes and materials may be implemented to form the fins 44 and isolation regions 48. For example, the fins 44 may include or be heteroepitaxial structures that include a semiconductor material lattice mismatched from the semiconductor material of the semiconductor substrate 40.

The dummy gate stacks (or more generally, gate structures) are formed on the fins 44 for a replacement gate process, as described herein. The interfacial dielectrics 50 may include or be silicon oxide, silicon nitride, the like, or multilayers thereof. The dummy gates 52 may include or be silicon (e.g., polysilicon) or another material. The masks 54 may include or be silicon nitride, silicon oxynitride, silicon carbon nitride, the like, or a combination thereof. Layers for the interfacial dielectrics 50, dummy gates 52, and masks 54 for the dummy gate stacks may be sequentially deposited or formed, such as by any acceptable deposition technique, and then patterned, for example, using photolithography and one or more etch processes, into the dummy gate stacks. Other materials and/or techniques may be used to form operational (as opposed to dummy) gate stacks in other processes, such as a gate first process.

FIG. 1 further illustrates reference cross-sections that are used in later figures. Cross-section A-A is in a plane along, e.g., channels in one fin 44 between opposing source/drain regions. Cross-section B-B is in a plane perpendicular to cross-section A-A and is across source/drain regions in different respective fins 44. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. FIGS. 2A and 2B illustrate cross-sectional views of the intermediate structure of FIG. 1 at the cross-sections A-A and B-B, respectively.

Figure 3B:
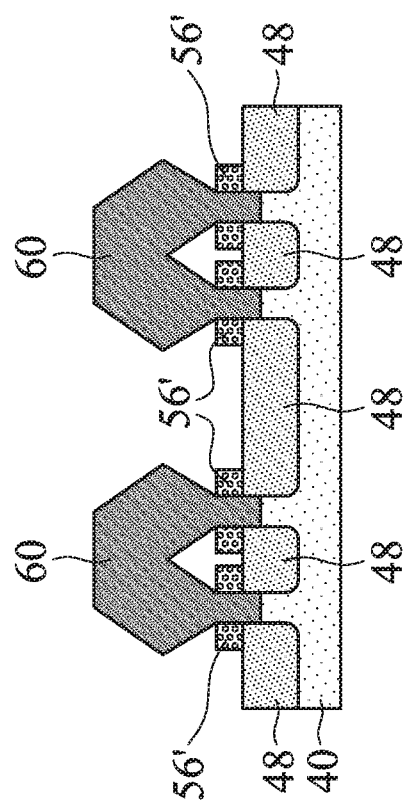
Figure 3A:
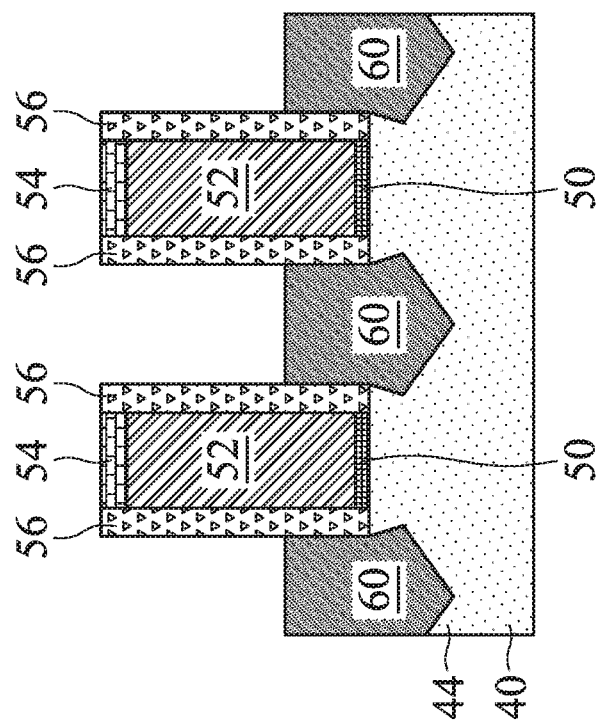

FIGS. 3A and 3B illustrate the formation of gate spacers 56 and epitaxial source/drain regions 60. Gate spacers 56 are formed along sidewalls of the dummy gate stacks and over the fins 44. Residual gate spacers 56' may also be formed along sidewalls of the fins 44, for example, depending on the height of the fins 44 above the isolation regions 48. The gate spacers 56 may be formed by conformally depositing one or more layers for the gate spacers 56 and anisotropically etching the one or more layers, for example, by appropriate processes. The one or more layers for the gate spacers 56 may include or be silicon oxygen carbide, silicon nitride, silicon oxynitride, silicon carbon nitride, the like, multilayers thereof, or a combination thereof.

Recesses are formed in the fins 44 on opposing sides of the dummy gate stacks. The recessing can be by an etch process. The etch process can be isotropic or anisotropic, or further, may be selective with respect to one or more crystalline planes of the semiconductor substrate 40. Hence, the recesses can have various cross-sectional profiles based on the etch process implemented. The etch process may be a dry etch, such as a reactive ion etch (RIE), neutral beam etch (NBE), or the like, or a wet etch, such as using tetramethyalammonium hydroxide (TMAH), ammonium hydroxide ($NH_4OH$), or another etchant.

The epitaxial source/drain regions 60 are formed in the recesses. The epitaxial source/drain regions 60 may include or be silicon germanium, silicon carbide, silicon phosphorus, silicon carbon phosphorus, a III-V compound semiconductor, a II-VI compound semiconductor, or the like. The epitaxial source/drain regions 60 may be formed in the recesses by epitaxially growing a material in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. In some examples, due to blocking by the isolation regions 48, epitaxial source/drain regions 60 are first grown vertically in recesses, during which time the epitaxial source/drain regions 60 do not grow horizontally. After the recesses between the isolation regions 48 are fully filled, the epitaxial source/drain regions 60 may grow both vertically and horizontally to form facets, which may correspond to crystalline planes of the semiconductor substrate 40. In some examples, an epitaxial source/drain region 60 in a first fin 44 can be epitaxially grown to merge with an epitaxial source/drain region 60 in a neighboring, second fin 44. In other examples, the epitaxial source/drain regions 60 may be un-merged (e.g., may be individual epitaxial source/drain regions 60). In further examples, the epitaxial source/drain regions 60 may be in any merged and/or un-merged configuration and may be subsequently electrically connected through one or more conductive features (e.g., one or more contacts) formed to epitaxial source/drain regions 60. In the illustration of FIG. 3B, two merged source/drain regions are shown, with each merged source/drain region having two epitaxial source/drain regions 60 of respective fins 44. In some examples, different materials are used for epitaxial source/drain regions for p-type devices and n-type devices. Appropriate masking during the recessing or epitaxial growth may permit different materials to be used in different devices. In some examples, the epitaxial source/drain regions 60 may also be doped, such as by in situ doping during epitaxial growth and/or by implanting dopants into the epitaxial source/drain regions 60 after epitaxial growth. Hence, a source/drain region may be delineated by doping (e.g., by in situ doping during epitaxial growth) and/or by epitaxial growth, which may further delineate the active area in which the source/drain region is delineated.

Figure 4B:
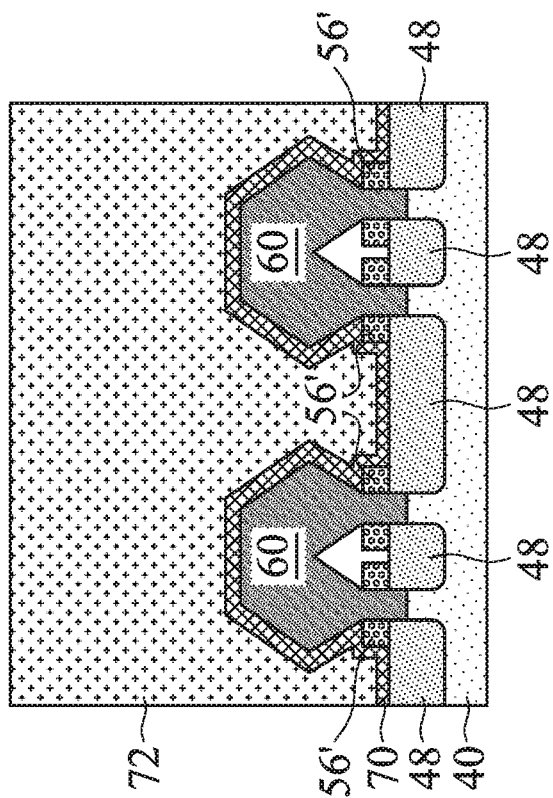
Figure 4A:
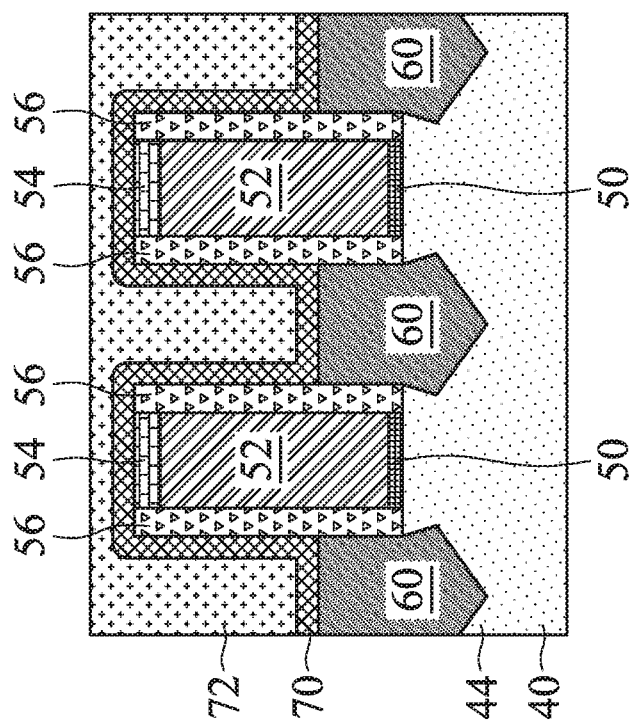

FIGS. 4A and 4B illustrate the formation of a contact etch stop layer (CESL) 70 and a first interlayer dielectric (ILD) 72 over the CESL 70. Generally, an etch stop layer (ESL)

can provide a mechanism to stop an etch process when forming, e.g., contacts or vias by having a different etch selectivity from adjacent layers or components. The CESL 70 is conformally deposited on surfaces of the epitaxial source/drain regions 60, sidewalls and top surfaces of the gate spacers 56, top surfaces of the masks 54, and top surfaces of the isolation regions 48. The CESL 70 may comprise or be silicon nitride, silicon carbon nitride, silicon carbon oxide, carbon nitride, the like, or a combination thereof. The first ILD 72 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The CESL 70 and first ILD 72 may be deposited by any acceptable deposition technique.

The first ILD 72 may be planarized after being deposited, such as by a chemical mechanical planarization (CMP). In a gate-first process, a top surface of the first ILD 72 may be above the upper portions of the CESL 70 and the gate stacks, and some processing described below with respect to FIGS. 5A-B for forming a replacement gate structure may be omitted. Hence, the upper portions of the CESL 70 and first ILD 72 may remain over the gate stacks.

Figure 5B:
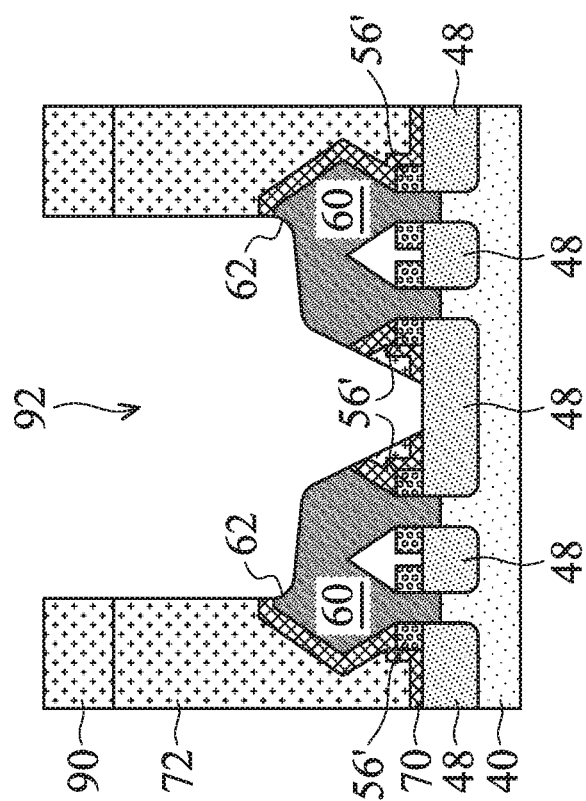
Figure 5A:
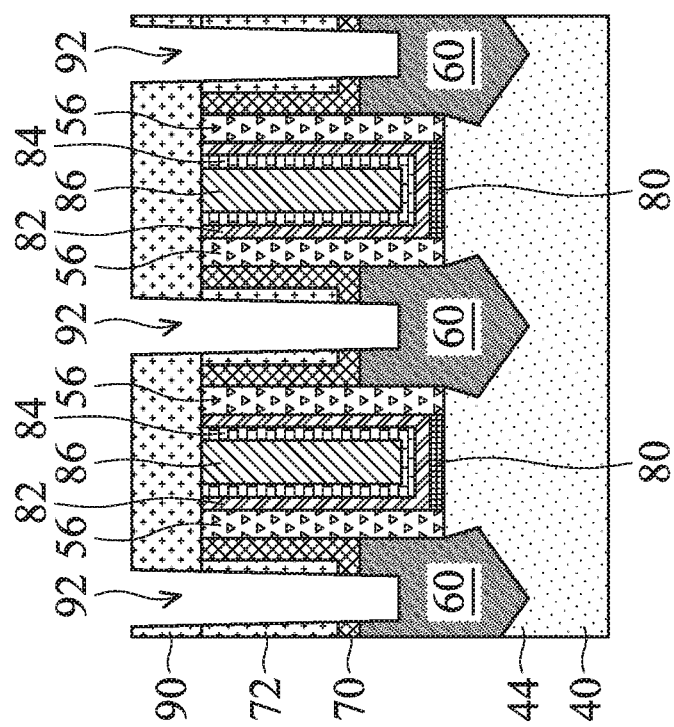

FIGS. 5A and 5B illustrate the replacement of the dummy gate stacks with replacement gate structures, the formation of a second ILD 90, and the formation of openings 92 to the epitaxial source/drain regions 60. The first ILD 72 and CESL 70 are formed with top surfaces coplanar with top surfaces of the dummy gates 52, such as by a planarization process, such as a CMP. The CMP may also remove the masks 54 (and, in some instances, upper portions of the gate spacers 56) on the dummy gates 52. Accordingly, top surfaces of the dummy gates 52 are exposed through the first ILD 72 and the CESL 70. With the dummy gates 52 exposed through the first ILD 72 and the CESL 70, the dummy gates 52 are removed, such as by one or more acceptable etch processes. Recesses are formed between gate spacers 56 where the dummy gate stacks are removed, and channel regions of the fins 44 are exposed through the recesses.

The replacement gate structures are formed in the recesses where the dummy gate stacks were removed. The replacement gate structures each include, as illustrated, an interfacial dielectric 80, a gate dielectric layer 82, one or more optional conformal layers 84, and a gate conductive fill material 86. The interfacial dielectric 80, a gate dielectric layer 82, one or more optional conformal layers 84, and a gate conductive fill material 86 can be deposited by any appropriate deposition technique. The interfacial dielectric 80 is formed on sidewalls and top surfaces of the fins 44 along the channel regions. The interfacial dielectric 80 can be, for example, the interfacial dielectric 50 if not removed, an oxide (e.g., silicon oxide), and/or another oxide (e.g., silicon oxide), nitride (e.g., silicon nitride), and/or another dielectric layer. The gate dielectric layer 82 can be conformally deposited in the recesses where dummy gate stacks were removed (e.g., on top surfaces of the isolation regions 48, on the interfacial dielectric 80, and sidewalls of the gate spacers 56) and on the top surfaces of the first ILD 72, the CESL 70, and gate spacers 56. The gate dielectric layer 82 can be or include silicon oxide, silicon nitride, a high-k dielectric material, multilayers thereof, or other dielectric material.

Then, the one or more optional conformal layers 84 can be conformally (and sequentially, if more than one) deposited on the gate dielectric layer 82. The one or more optional conformal layers 84 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 86 is formed over the one or more optional conformal layers 84, if implemented, and/or the gate dielectric layer 82. The gate conductive fill material 86 can fill remaining recesses where the dummy gate stacks were removed. The gate conductive fill material 86 may be or comprise a metal-containing material such as tungsten, cobalt, aluminum, ruthenium, copper, multi-layers thereof, a combination thereof, or the like. A CMP may remove excess gate conductive fill material 86, one or more optional conformal layers 84, and gate dielectric layer 82. The replacement gate structures comprising the gate conductive fill material 86, one or more optional conformal layers 84, gate dielectric layer 82, and interfacial dielectric 80 may therefore be formed as illustrated in FIG. 5A.

The second ILD 90 is formed over the first ILD 72, CESL 70, gate spacers 56, and replacement gate structures. The second ILD 90 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 90 may be deposited by any appropriate deposition technique.

Respective openings 92 are formed through the second ILD 90, the first ILD 72, and the CESL 70 to expose at least a portion of respective epitaxial source/drain regions 60. The second ILD 90, the first ILD 72, and the CESL 70 may be patterned with the openings 92, for example, using photolithography and one or more etch processes. As shown in FIG. 5B, the opening 92 exposes at least respective portions of the two merged source/drain regions. Further, the one or more etch processes used to form the opening 92 etches into the epitaxial source/drain regions 60 thereby creating sidewalls 62 in the epitaxial source/drain regions 60.

Figure 6B:
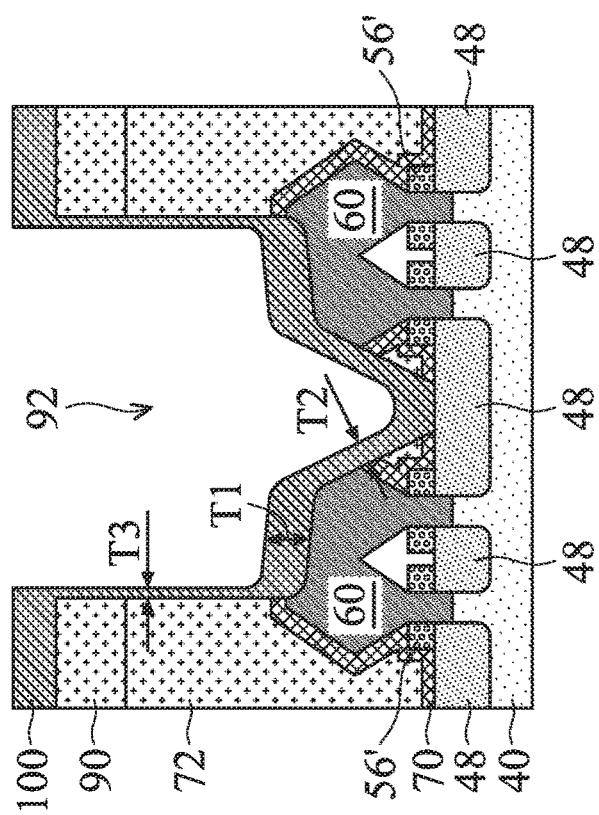
Figure 6A:
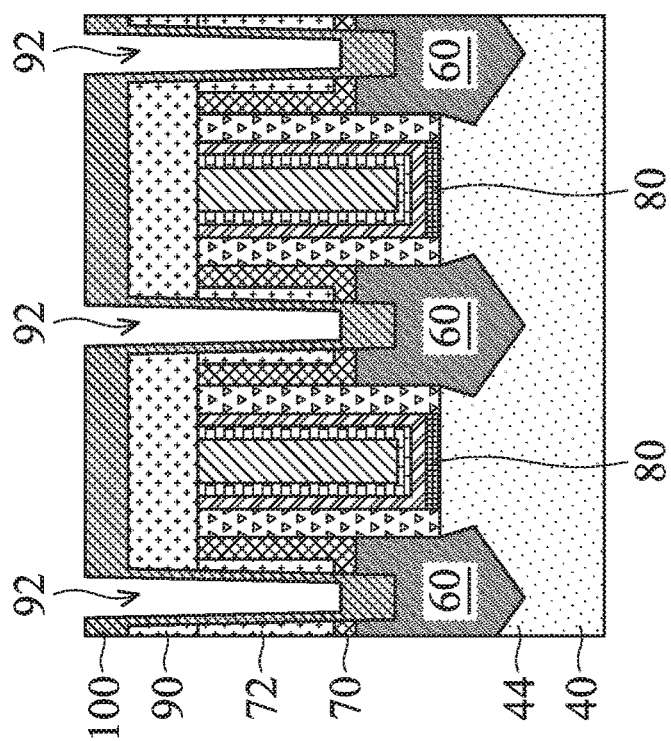

FIGS. 6A and 6B illustrate the formation of a metal layer 100 (e.g., which may be implemented as a dual metal layer) in the openings 92 using a directional-dependent deposition. The metal layer 100 is formed by directional-dependent deposition on a top surface of the second ILD 90 and along surfaces of the openings 92 (e.g., sidewalls of the second ILD 90, first ILD 72, and CESL 70, and surfaces of the epitaxial source/drain regions 60). The metal layer 100 can be or comprise titanium, tantalum, cobalt, nickel, nickel platinum, ruthenium, or another metal (e.g., a metal that may be silicided). The directional-dependent deposition can be a physical vapor deposition (PVD), a selective chemical vapor deposition (CVD), or another deposition technique. The directional-dependent deposition deposits the metal layer 100 with a varying thickness as a function of an orientation of the supporting surface on which the metal layer 100 is deposited. For example, the thickness of the metal layer 100 can depend on the slope angle of a tangent (generally, "slope angle") of the supporting surface with respect to a horizontal or major plane or orientation of the underlying semiconductor substrate 40, such as a 0° slope angle would indicate a horizontal surface, and a 90° slope angle would indicate a vertical surface in the illustrations. In some examples, the metal layer 100 is deposited with a greatest thickness on a horizontal surface (e.g., 0° slope angle) and with a smallest thickness on a vertical surface (e.g., 90° slope angle), with a decreasing thickness therebetween from the greatest thickness to the smallest thickness corresponding to an increasing slope angle.

FIG. 6B illustrates different thicknesses of the metal layer 100 as deposited on various surfaces of the opening 92. A first thickness T1 of the metal layer 100 is at a substantially horizontal surface (e.g., approximately 0° slope angle). A second thickness T2 of the metal layer 100 is at a sloped surface (e.g., approximately 45° slope angle). A third thickness T3 of the metal layer 100 is at a substantially vertical surface (e.g., approximately 90° slope angle). As seen in FIG. 6B, the first thickness T1 is greater than the second thickness T2, which is greater than the third thickness T3. In some examples, the first thickness T1 can be in a range from about 1 nm to about 10 nm, and the second thickness T2 and the third thickness T3 can each be in a range from greater than 0 nm to about 10 nm. In some examples, a ratio of the first thickness T1 to the third thickness T3 is about 8 or greater, such as about 10 or greater, and more particularly, such as about 50. Hence, the metal layer 100 can be deposited on a substantially horizontal surface at a rate of 8 times or more (e.g., about 10 times or more, such as about 50 times) faster than on a substantially vertical surface.

The physical sputtering implemented by a PVD process can result in the directional-dependent deposition of the metal layer 100. In a selective CVD process, the metal layer 100 can be deposited on the epitaxial source/drain region 60 (e.g., germanium in SiGe) at a greater rate than on dielectric surfaces, such as surfaces of the CESL 70, first ILD 72, and second ILD 90. Hence, the directional-dependency of the selective CVD process may result from an underlying structure on which the metal layer 100 is deposited. For example, substantially horizontal surfaces are surfaces of the epitaxial source/drain region 60 on which the metal layer 100 may be deposited at a greater rate by the selective CVD process compared to the substantially vertical surfaces that are dielectric surfaces of the CESL 70, first ILD 72, and second ILD 90.

Figure 7B:
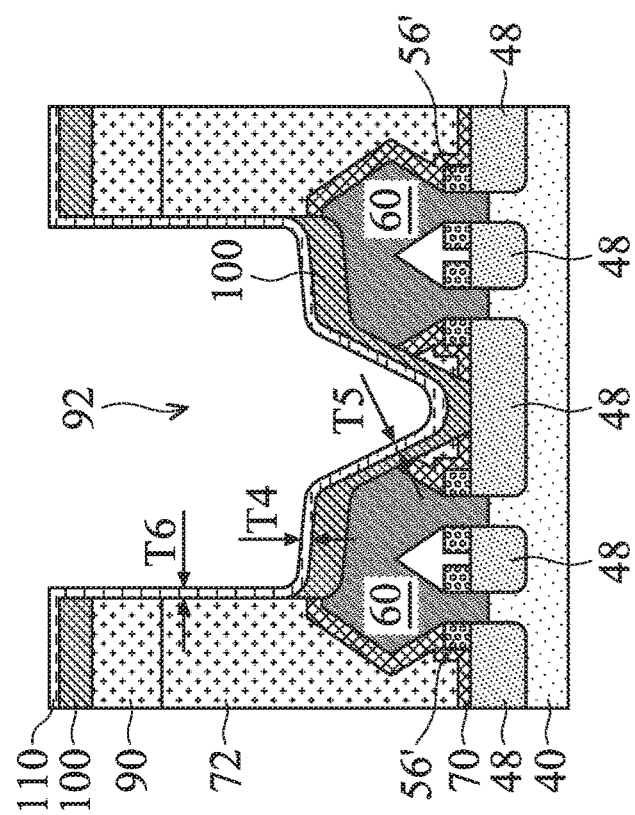
Figure 7A:
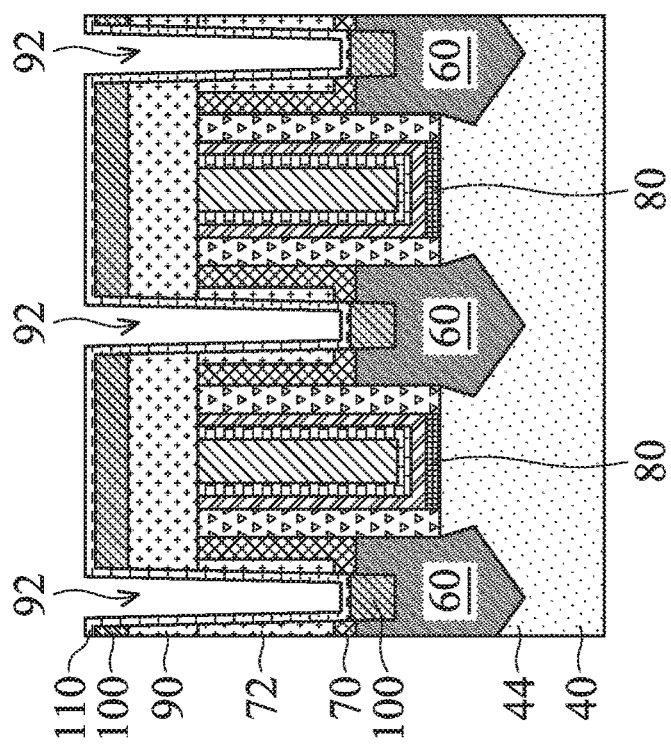

FIGS. 7A and 7B illustrate a first-treated barrier layer 110 formed from a portion of the metal layer 100 by a first plasma process. The first plasma process has a low or no directional-dependency. The first plasma process exposes the metal layer 100 to a nitrogen-containing plasma, which nitrides a portion of the metal layer 100 to form the first-treated barrier layer 110. Because the first plasma process has a low or no directional-dependency, the nitridation of the portion of the metal layer 100 is near or fully conformal. The first plasma process is performed to nitride the third thickness T3 of the portion of the metal layer 100 along vertical surfaces (e.g., along sidewalls of the opening 92). The first plasma process may fully nitride the portions of the metal layer 100 along the dielectric sidewalls of the opening 92, for example. As will become apparent, the multi-plasma process and directional deposition of the metal layer 100 described herein permit the thickness of the metal layer 100 and subsequent barrier layer formed on the sidewalls of the opening 92 to be thinner than what may have been previously implemented while obtaining a sufficient thickness of the barrier layer elsewhere, such as on an epitaxial source/drain region 60.

The first plasma process, in some examples, is a high pressure plasma process. The first plasma process can be implemented with a capacitively coupled plasma (CCP). The first plasma process uses a nitrogen-containing gas, such as nitrogen ($N_2$), ammonia ($NH_3$), nitrous oxide ($N_2O$), a forming gas (e.g., $N_2/H_2$ mixture), the like, or a combination thereof, and a carrier gas, such as hydrogen ($H_2$), argon (Ar), or the like. A flow rate of the nitrogen-containing gas during the first plasma process can be a high flow rate, such as in a range from about 2,000 sccm to about 3,000 sccm. A flow rate of the carrier gas during the first plasma process can be equal to the flow rate of the nitrogen-containing gas, although other flow rates of the carrier gas may be used. A pressure of the first plasma process can be greater than or equal to about 5 Torr. The power of the plasma generator of the plasma process can be a low power, such as in a range from 1 W to about 1000 W. A temperature of the first plasma process can be a low temperature, such as from room temperature (e.g., about 23° C.) to about 400° C. The plasma of the first plasma process can be a high density and high energy plasma.

In some examples, if a high pressure plasma process is implemented for the first plasma process, the first plasma process can be implemented by multiple cycles of the high pressure plasma. Each cycle can include a duration in which the metal layer 100 is exposed to the high pressure plasma (e.g., "plasma on" stage) and a subsequent duration in which the high pressure plasma is removed from exposure to the metal layer 100 (e.g., "plasma off" or "cooling" stage). The duration in which the metal layer 100 is exposed to the high pressure plasma can be in a range from about 5 seconds to about 120 seconds. In some examples, the cycle can be repeated in a range from 5 times to 10 times. By performing multiple cycles in these examples, densification and shrinkage of some components on the semiconductor substrate 40, such as gate spacers 56, can be reduced compared to a single, longer duration high pressure plasma exposure. By reducing the densification and shrinkage of gate spacers 56, increases in dielectric values (k-values) of the gate spacers 56 and corresponding parasitic capacitances can be reduced. Further, by implementing multiple cycles, the structures subjected to the plasma process may be not heat up as much compared to performing a single cycle plasma process.

A fourth thickness T4 of the first-treated barrier layer 110 is at a substantially horizontal surface (e.g., approximately 0° slope angle). A fifth thickness T5 of the first-treated barrier layer 110 is at a sloped surface (e.g., approximately 45° slope angle). A sixth thickness T6 of the first-treated barrier layer 110 is at a substantially vertical surface (e.g., approximately 90° slope angle). The fourth, fifth, and sixth thicknesses T4, T5, T6 are substantially equal, although the fourth thickness T4 can be slightly greater than the fifth thickness T5, which can be slightly greater than the sixth thickness T6. In some examples, the fourth thickness T4 can be in a range from about 0.5 nm to about 3 nm, and the fifth thickness T5 and the sixth thickness T6 can each be in a range from about 0.5 nm to about 3 nm. In some examples, a ratio of the fourth thickness T4 to the sixth thickness T6 is less than about 2, such as in a range from about 1.5 to about 5. Hence, the metal layer 100 can be nitrided on a substantially horizontal surface at a rate of 2 times or less than a substantially vertical surface to form the first-treated barrier layer 110.

Figure 8B:
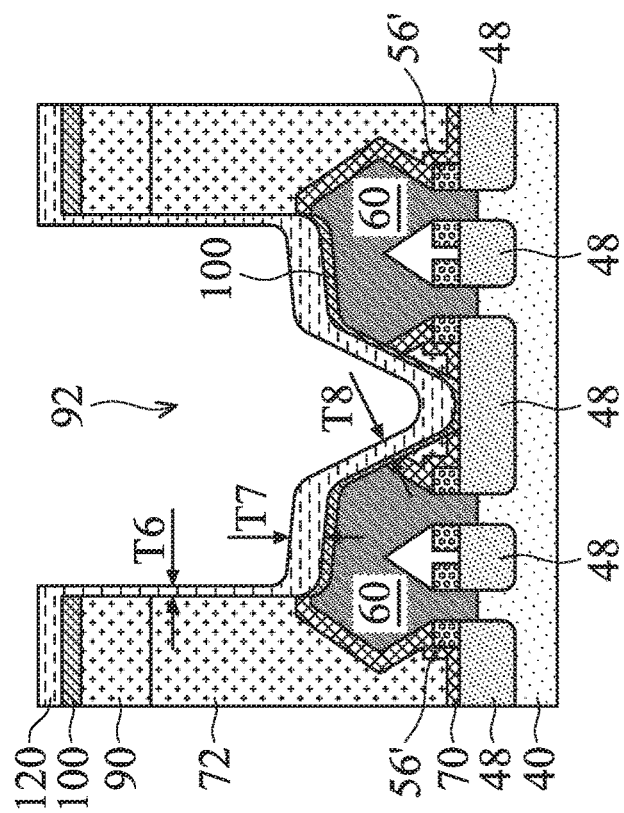
Figure 8A:
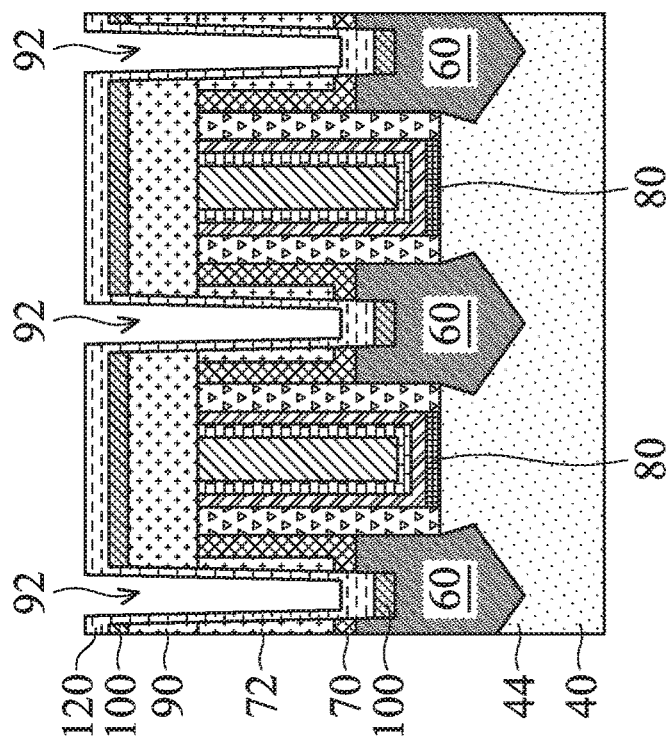

FIGS. 8A and 8B illustrate a second-treated barrier layer 120 formed from a portion of the metal layer 100 by a second plasma process and including the first-treated barrier layer 110. The second plasma process has a higher directional-dependency than the first plasma process. The second plasma process exposes the metal layer 100 and first-treated barrier layer 110 to a nitrogen-containing plasma, which further nitrides a portion of the metal layer 100 to form the second-treated barrier layer 120. Hence, the barrier layer 120 may be a metal nitride (e.g., TiN). Because the second plasma process has a higher directional-dependency, the nitridation of the portion of the metal layer 100 can vary based on the orientation of the supporting surface of the metal layer 100. The second plasma process is performed to nitride portions of the metal layer 100 along low slope angled surfaces (e.g., along upper horizontal surfaces of the epitaxial source/drain regions 60). This can form a thicker second-treated barrier layer 120 along the epitaxial source/drain regions 60 without significantly further nitriding portions of the metal layer 100 along, e.g., sidewalls 62 of the epitaxial source/drain regions 60. Hence, portions of metal layer 100 can remain along sidewalls 62 of the epitaxial source/drain regions 60 after forming the second-treated barrier layer 120.

The second plasma process, in some examples, is a low pressure plasma process. The second plasma process can be implemented with a capacitively coupled plasma (CCP). The second plasma process uses a nitrogen-containing gas, such as nitrogen ($N_2$), ammonia ($NH_3$), ammonium (NH), the like, or a combination thereof, and a carrier gas, such as hydrogen ($H_2$), argon (Ar), or the like. A flow rate of the nitrogen-containing gas during the second plasma process can be a high flow rate, such as in a range from about 2,000 sccm to about 3,000 sccm. A flow rate of the carrier gas during the second plasma process can be equal to the flow rate of the nitrogen-containing gas, although other flow rates of the carrier gas may be used. A pressure of the second plasma process can be less than or equal to about 2 Torr. The power of the plasma generator of the plasma process can be a high power, such as in a range from 100 W to about 2000 W. A temperature of the second plasma process can be a low temperature, such as from room temperature (e.g., about 23° C.) to about 400° C. The plasma of the second plasma process can be a low density and low energy plasma. A substrate holder can be biased with an RF power in a range from about 100 W to about 2000 W, such as 750 W, during the second plasma process. A duration in which the metal layer 100 and first-treated barrier layer 110 is exposed to the low pressure plasma can be in a range from about 5 seconds to about 120 seconds.

A seventh thickness T7 of the second-treated barrier layer 120 is at a substantially horizontal surface (e.g., approximately 0° slope angle). An eighth thickness T8 of the second-treated barrier layer 120 is at a sloped surface (e.g., approximately 45° slope angle). The sixth thickness T6 of the second-treated barrier layer 120 is at a substantially vertical surface (e.g., approximately 90° slope angle) and remains from the first-treated barrier layer 110. The seventh thickness T7 is greater than the eighth thickness T8, which is greater than the sixth thickness T6. In some examples, the seventh thickness T7 can be in a range from about 0.5 nm to about 5 nm and the eighth thickness T8 can be in a range from about 0.5 nm to about 4 nm. The metal layer 100 and first-treated barrier layer 110 can be nitrided on a substantially horizontal surface at a rate of 4 times or more than a substantially vertical surface to form the second-treated barrier layer 120.

Although described herein as implementing two plasma processes to form the barrier layer 120, other examples can implement more plasma processes to form the barrier layer 120.

After the second plasma process, portions of the metal layer 100 can remain along sidewalls 62, other substantially non-horizontal surfaces, and substantially horizontal surfaces of the epitaxial source/drain regions 60. These portions of the metal layer 100 can remain without being nitrided by the multiple plasma processes.

Figure 9B:
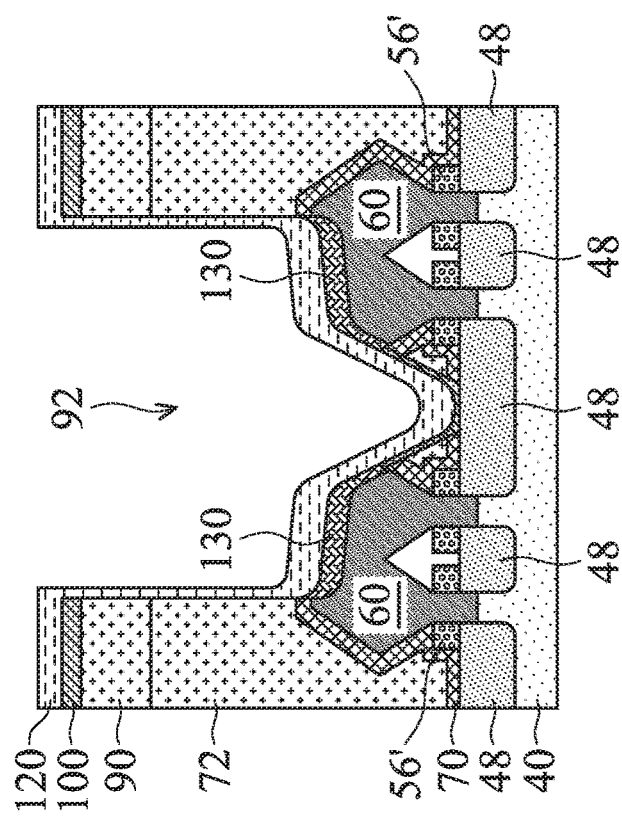
Figure 9A:
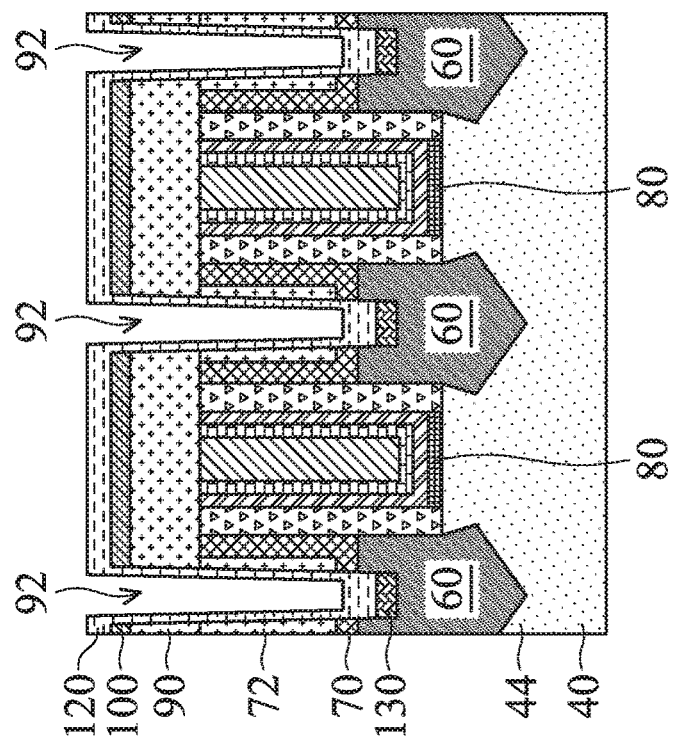

FIGS. 9A and 9B illustrate the formation of silicide regions 130 along the epitaxial source/drain regions 60. The silicide regions 130 (e.g., TiSi or TiSiGe) are formed on the epitaxial source/drain regions 60 by reacting respective upper portions of the epitaxial source/drain regions 60 with the metal layer 100. An anneal is performed to facilitate the reaction of the epitaxial source/drain regions 60 with the metal layer 100. The anneal can be, for example, a rapid thermal anneal (RTA) with a temperature in a range from about 500° C. to about 700° C., although other annealing processes and/or other temperatures may be implemented. As described in more detail below, since portions of the metal layer 100 remained along sidewalls 62 and other substantially non-horizontal surfaces of the epitaxial source/drain regions 60 after the multiple plasma processes, the epitaxial source/drain regions 60 can react with those portions of the metal layer 100 to form the silicide regions 130 at the sidewalls 62 and other substantially non-horizontal surfaces of the epitaxial source/drain regions 60.

Figure 10B:
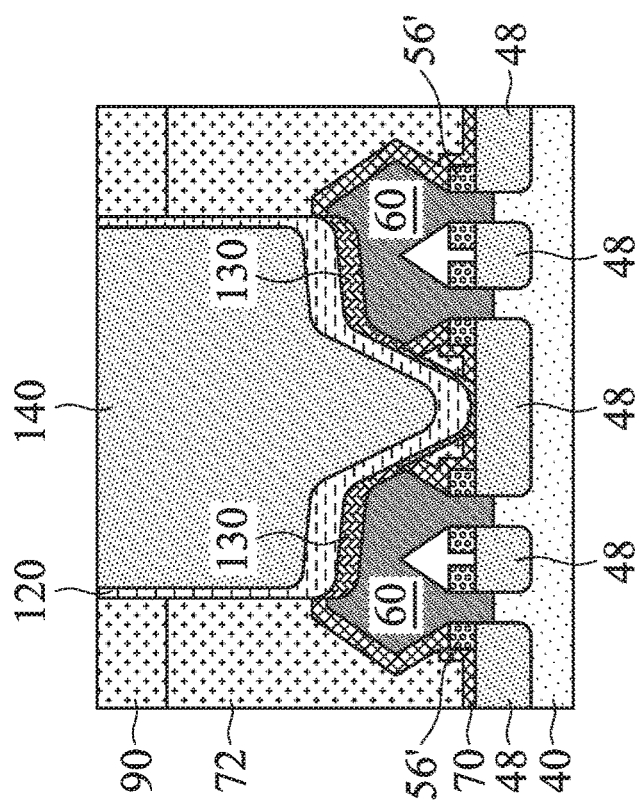
Figure 10A:
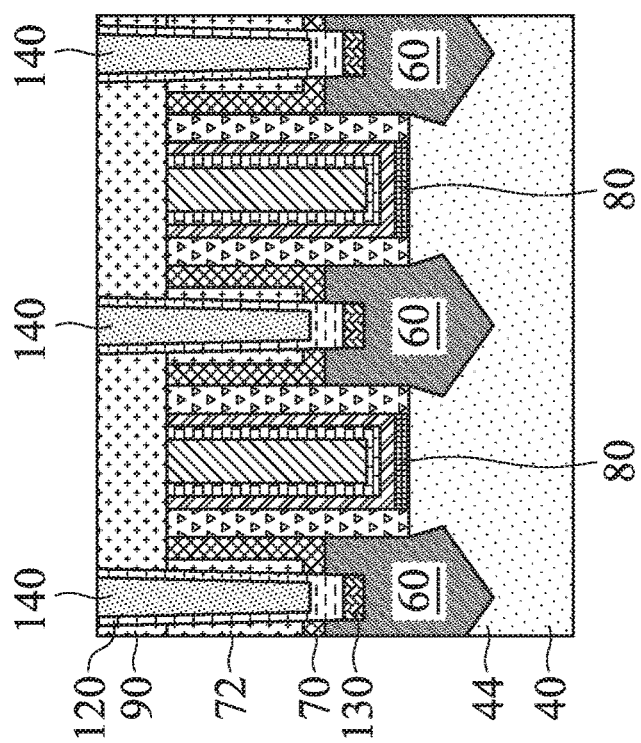

FIGS. 10A and 10B illustrate the formation of conductive fill material 140 in the openings 92 to fill the openings 92. The conductive fill material 140 can be deposited on the barrier layer 120 and fill the openings 92. The conductive fill material 140 may be or comprise cobalt, tungsten, copper, ruthenium, aluminum, gold, silver, alloys thereof, the like, or a combination thereof, and may be deposited by CVD, atomic layer deposition (ALD), PVD, or another deposition technique. After the conductive fill material 140 is deposited, excess conductive fill material 140, barrier layer 120, and metal layer 100 may be removed by using a planarization process, such as a CMP, for example. The planarization process may remove excess conductive fill material 140, barrier layer 120, and metal layer 100 from above a top surface of the second ILD 90. Hence, top surfaces of the conductive features (comprising the conductive fill material 140, barrier layer 120, and silicide regions 130) and the second ILD 90 may be coplanar. The conductive features may be or may be referred to as contacts, plugs, etc.

Figure 11:
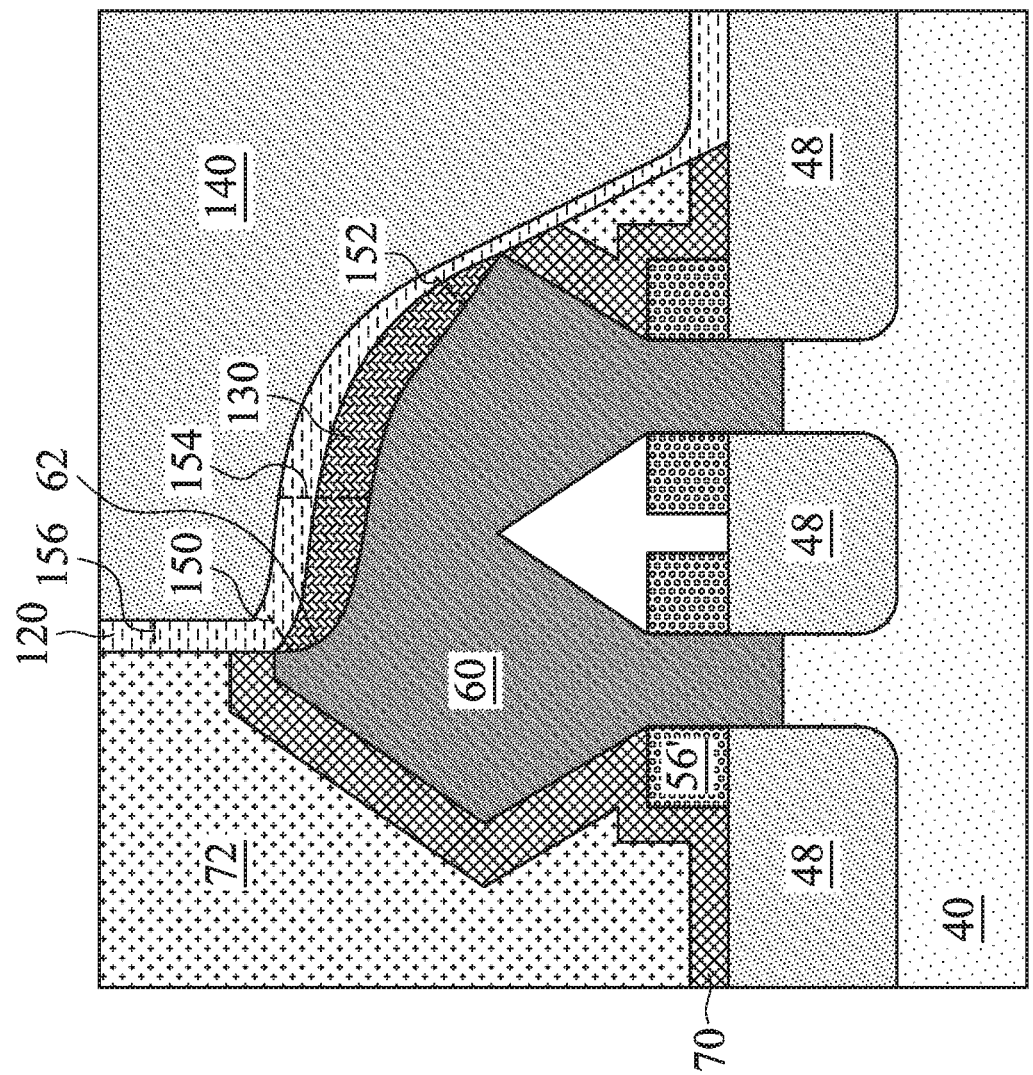
FIG. 11 is a cross-sectional view of a portion of the intermediate structure of FIG. 10B in accordance with some embodiments.

FIG. 11 is a cross-section view of a portion of the structure of FIG. 10B in accordance with some embodiments. The silicide region 130 in FIG. 11 extends along substantially all of the surfaces of the epitaxial source/drain region 60 to which the conductive feature (comprising the conductive fill material 140, barrier layer 120, and silicide region 130) contacts. The silicide region 130 is disposed between the epitaxial source/drain region 60 and the barrier layer 120, and the barrier layer 120 does not directly contact a substantial portion or any of the surfaces of the epitaxial source/drain region 60 to which the conductive feature contacts. The silicide region 130 extends along surfaces of the epitaxial source/drain region 60 that are horizontal and/or have a slope angle less than 40°, and further extends along surfaces of the epitaxial source/drain region 60 that have a slope angle of 40° or more, 50° or more, 60° or more, 70° or more, and 80° or more (e.g., including vertical sidewalls).

The example illustrated in FIG. 11 and described below is simply to illustrate aspects of an example, and other examples may have other features and dimensions. Locations 150, 152, 154, and 156 are illustrated by dashed lines to show directions of thicknesses across the silicide region 130 and barrier layer 120 described herein. The epitaxial source/drain region 60 has a sidewall 62 at location 150, a sloped surface at location 152, and a substantially horizontal surface at location 154. Location 156 is a sidewall of the first ILD 72 formed by the opening 92. A thickness of the silicide region 130 at location 150 is 0.95 nm, and a thickness of the barrier layer 120 at location 150 is 2.65 nm. A thickness of the silicide region 130 at location 152 is 3.21 nm, and a thickness of the barrier layer 120 at location 152 is 2.61 nm. A thickness of the silicide region 130 at location 154 is 6.33 nm, and a thickness of the barrier layer 120 at location 154 is 2.92 nm. A thickness of the barrier layer 120 at location 156 is 1.87 nm. Hence, a thickness of the barrier layer 120 at location 156 can be less than respective thicknesses of the barrier layer 120 at locations 150, 152, and 154. Further, a thickness of the barrier layer 120 at location 154 can be greater than respective thicknesses of the barrier layer 120 at locations 150 and 152.

As can be seen from FIG. 11, the silicide region 130 can be along the sidewall 62, sloped surface, and substantially horizontal surface of the epitaxial source/drain region 60. The directionality of the multiple plasma processes can cause a sufficiently thick barrier layer 120 to be formed along the epitaxial source/drain region 60 without consuming all of the metal at, e.g., the sidewall 62 or other substantially non-horizontal surface of the epitaxial source/drain region 60, and hence, silicide region 130 can be formed at the sidewall 62, sloped surface, and substantially horizontal surface of the epitaxial source/drain region 60. This can increase the contact area of the silicide region 130 with the epitaxial source/drain region 60, and can thereby reduce a contact resistance. Further, the silicide region 130 can be formed with more uniform thicknesses compared to other techniques to form a silicide region. Increasing uniformity of thicknesses in the silicide region 130 can reduce junction spiking in the epitaxial source/drain region 60. For example, the second plasma process described above can control thicknesses of the barrier layer 120 and the portions of the metal layer 100 on the epitaxial source/drain regions 60 to implement this increased uniformity.

Additionally, the thickness of the barrier layer 120 along the silicide region 130 can be sufficient to prevent oxidation of the silicide region 130 during subsequent processing. Hence, less oxidation may occur at an interface between the silicide region 130 and the barrier layer 120.

Further, in some examples using processes described herein, the silicide regions 130 and interfaces with the silicide regions 130 may be void free. In some processes, such as when a barrier layer is deposited (e.g., by ALD) independent of the formation of a silicide region, a void can form between the silicide region and the underlying epitaxial source/drain region. In tests, using multiple plasma processes to treat the metal layer 100 to form the barrier layer 120 and using remaining portions of the metal layer 100 to form the silicide regions 130 did not cause a void to form in the silicide regions 130 or at an interface with the respective silicide regions 130.

Even further, by using directional processes as described herein, a thickness of the barrier layer 120 on the sidewall of the opening 92 (e.g., sidewall of the first ILD 72 and second ILD 90) can be reduced. By reducing this thickness, an aspect ratio of the opening 92 can be reduced for filing the opening 92 with the conductive fill material 140, thereby creating a larger window for the deposition of the conductive fill material 140. This can cause increased yield of formed devices. Generally, the thickness of the barrier layer 120 on the sidewall of the opening 92 is less than the thickness of the barrier layer 120 along the silicide region 130, which may (i) improve gap filling capability of the conductive fill material 140, and (ii) improve protection of the silicide region 130.

In some examples, processes for forming the barrier layer 120 and silicide regions 130 (e.g., the deposition of the metal layer 100, multiple plasma processes, and anneal) are implemented without using any fluid (e.g., gas such as a precursor gas, carrier gas, and/or ambient gas; and/or liquid) that comprises carbon (C) or fluorine (F). This can cause the metal layer 100 and subsequently formed barrier layer 120 and silicide regions 130 to be free from carbon and fluorine. The barrier layer 120 can therefore have improved adhesion between, e.g., the first ILD 72 (and/or second ILD 90) and the conductive fill material 140.

Figure 12:
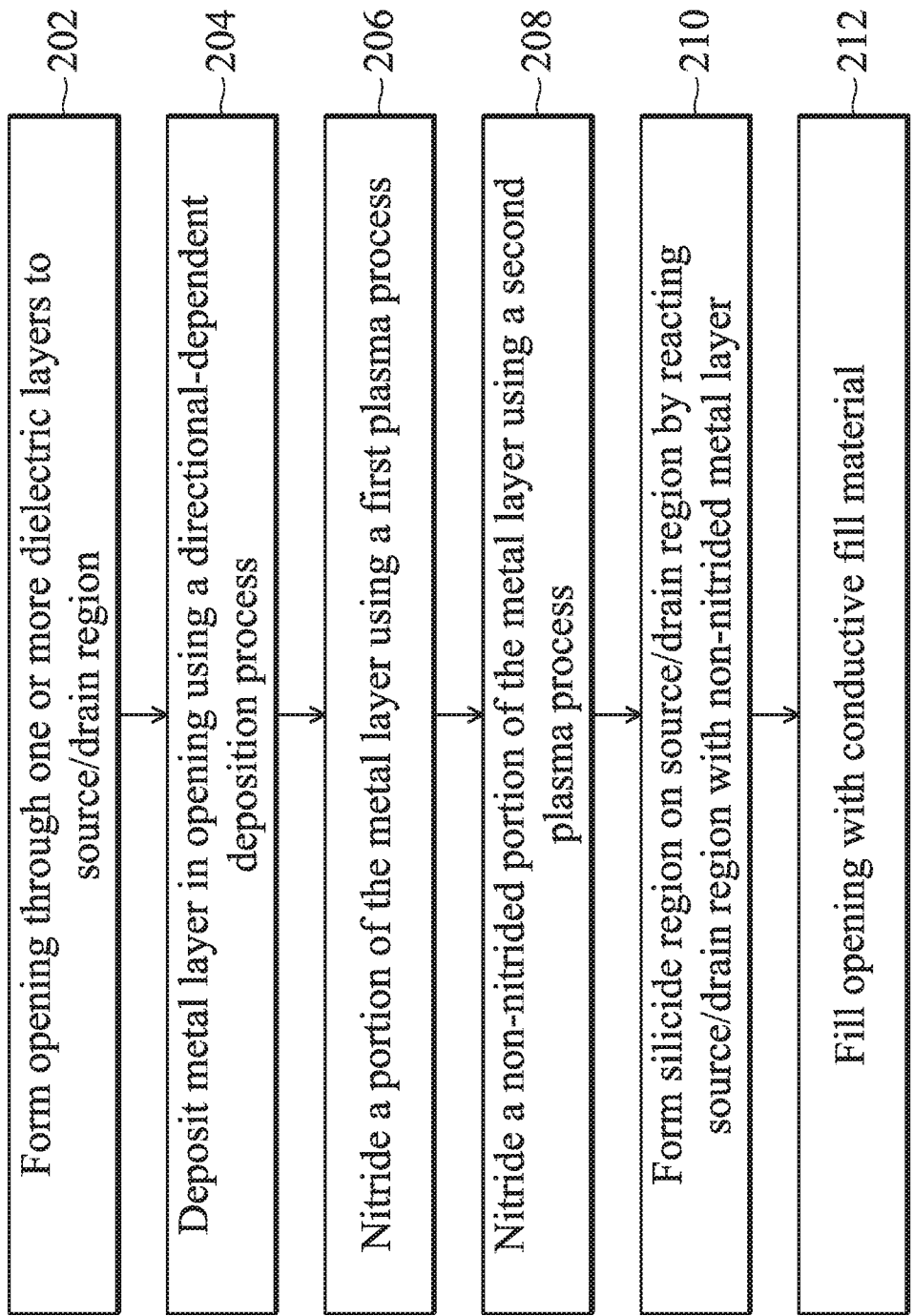
FIG. 12 is a flow chart of an example method for forming a conductive feature in accordance with some embodiments.
Figure 13:
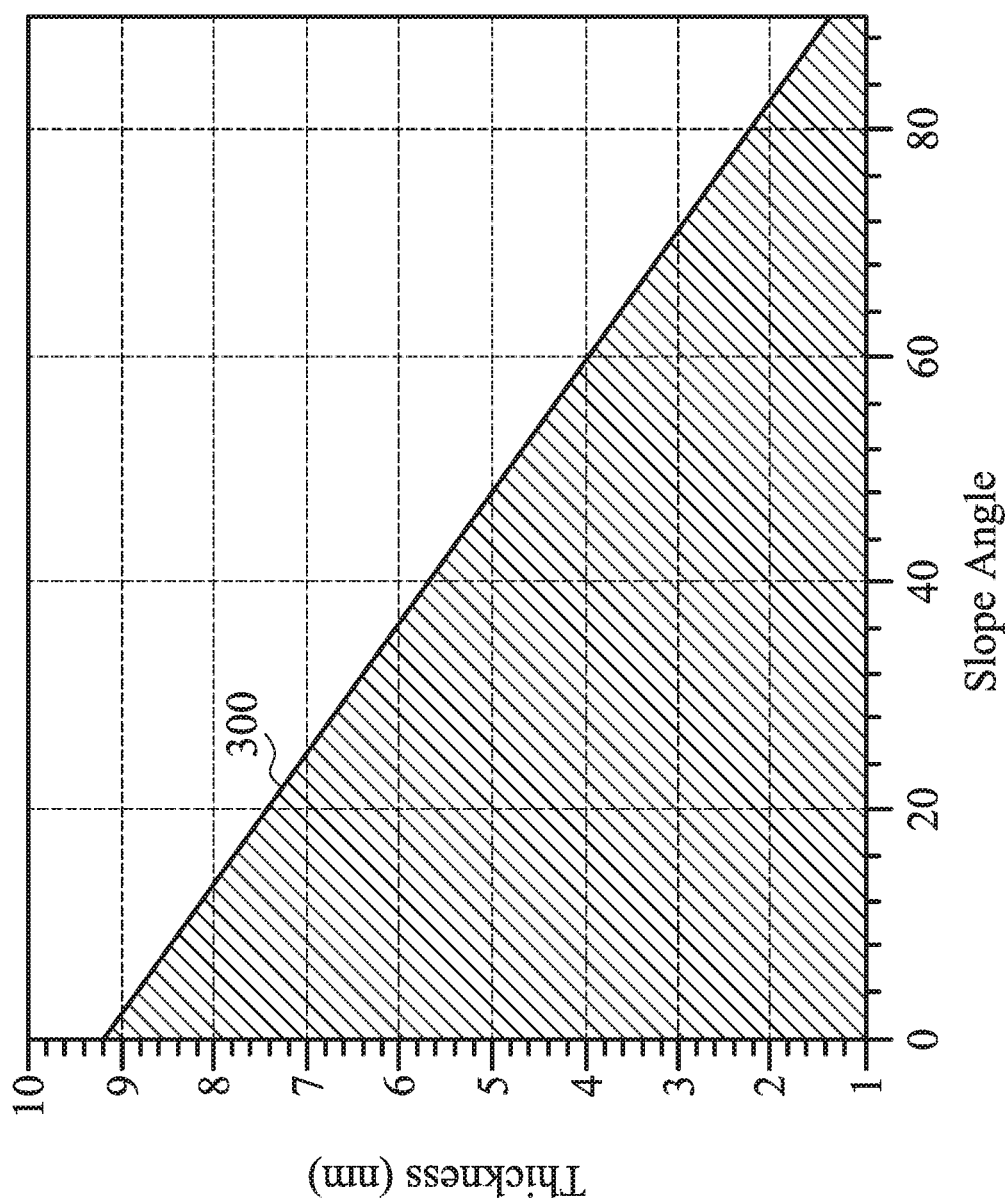
FIGS. 13 through 15 are graphs illustrating example thicknesses of materials at various stages of an example process for forming a conductive feature in accordance with some embodiments.
Figure 14:
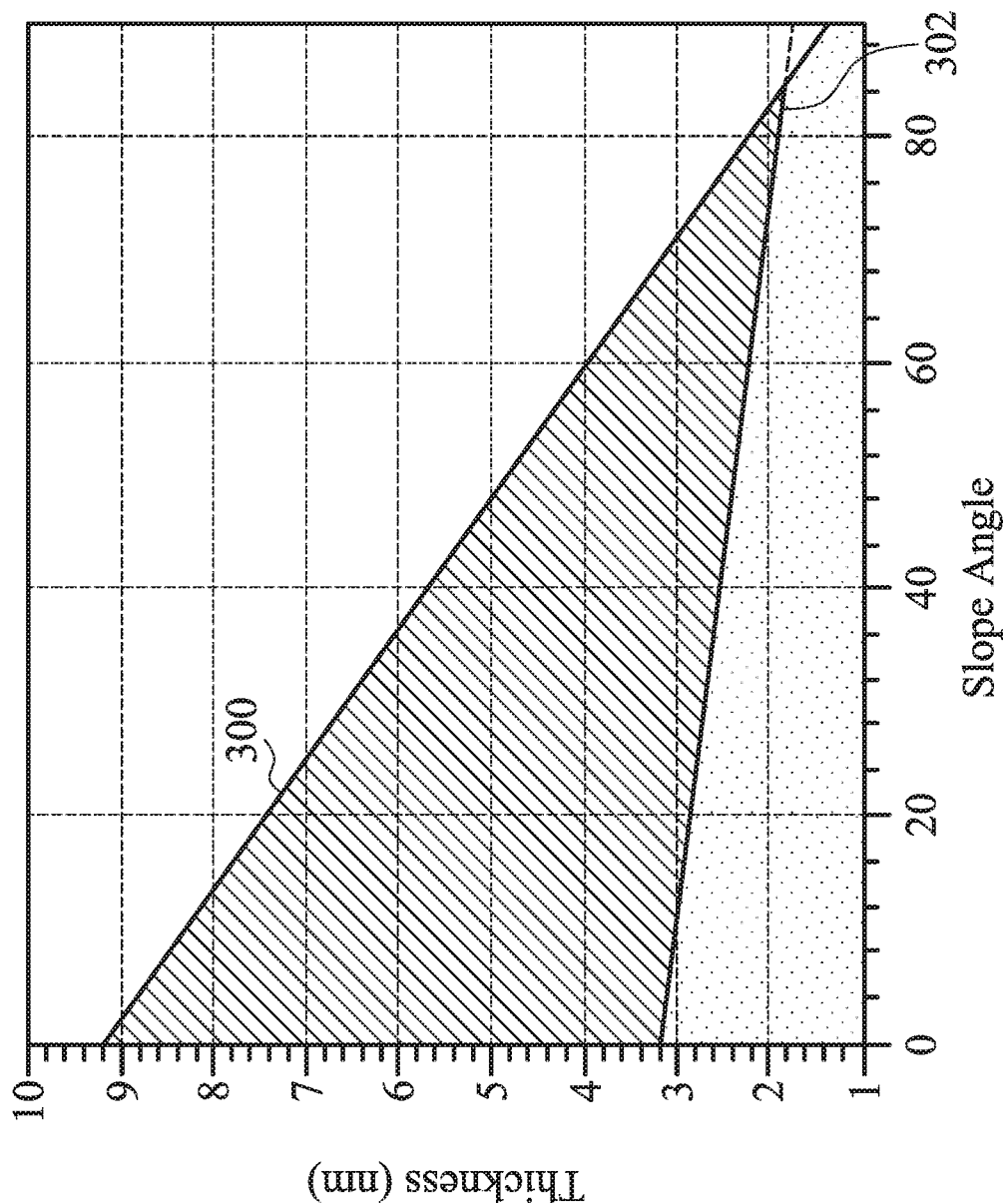
Figure 15:
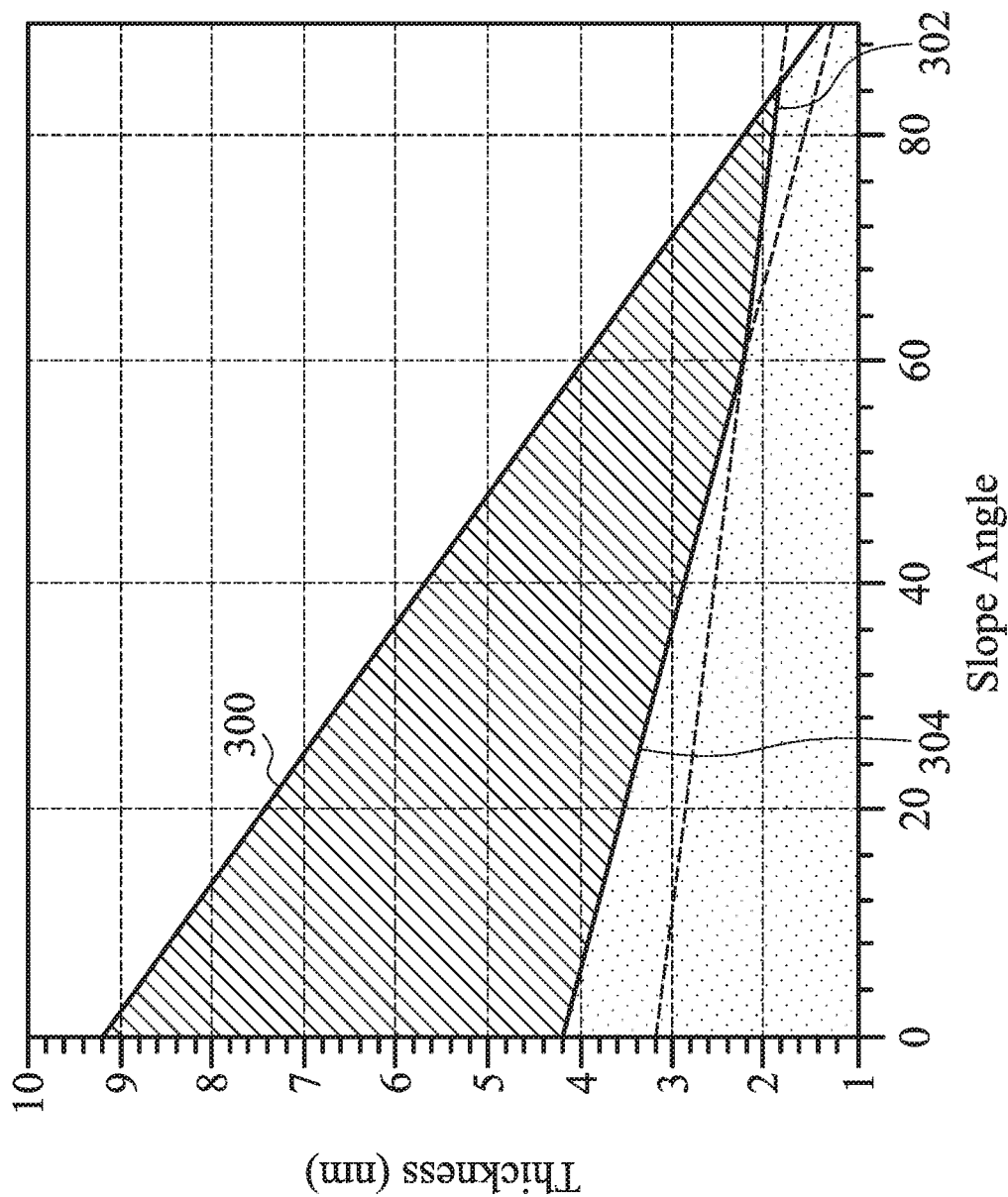

FIG. 12 is a flow chart of an example method for forming conductive features in accordance with some embodiments. FIGS. 13 through 15 are graphs depicting aspects of various operations of FIG. 12 in accordance with some embodiments.

In operation 202, an opening is formed through one or more dielectric layers to a source/drain region. An example of operation 202 is illustrated in and described with respect to FIGS. 5A and 5B. For example, the opening 92 is formed through the second ILD 90, the first ILD 72, and CESL 70 to the epitaxial source/drain regions 60.

In operation 204, a metal layer is deposited in the opening using a directional-dependent deposition process. An example of operation 204 is illustrated in and described with respect to FIGS. 6A and 6B. For example, the metal layer 100 is deposited in the opening 92 using, e.g., PVD or a selective CVD. As illustrated in the graph of FIG. 13, the metal layer can be deposited (e.g., as-deposited metal 300) with a thickness as a function of the slope angle of the underlying supporting surface.

In operation 206, a portion of the metal layer is nitrided using a first plasma process. An example of operation 206 is illustrated in and described with respect to FIGS. 7A and 7B. For example, a portion of the metal layer 100 is nitrided to form the first-treated barrier layer 110 using a first plasma process. As illustrated in the graph of FIG. 14, the metal layer can be nitrided (e.g., first-treated nitride 302) with a thickness as a function of the slope angle of the underlying supporting surface that has a low dependency on the slope angle (e.g., a low magnitude of the slope of the function).

In operation 208, a non-nitrided portion of the metal layer is nitrided using a second plasma process. An example of operation 208 is illustrated in and described with respect to FIGS. 8A and 8B. For example, a portion of the metal layer 100 is nitrided to form the second-treated barrier layer 120 using a second plasma process. As illustrated in the graph of FIG. 15, the metal layer can be nitrided (e.g., second-treated nitride 304) with a thickness as a function of the slope angle that has a higher dependency on the slope angle of the underlying supporting surface (e.g., a higher magnitude of the slope of the function). As illustrated in FIG. 15, the nitridation of the metal layer by the multiple plasma processes is generally not cumulative—e.g., the thickness of the nitridation caused by the second plasma process is not added to the thickness of the nitridation caused by the first plasma process, although some cumulative effect may occur at the intersection of boundary 302 and boundary 304. Hence, in the example of FIG. 15, the thickness of the nitrided metal layer is dominated by the nitridation of the second plasma process for surfaces having a slope angle of approximately 56° or less, and the thickness of the nitrided metal layer is dominated by the nitridation of the first plasma process for surfaces having a slope angle of approximately 56° or greater. As also seen in FIG. 15, as a result of the directional-dependent deposition and the multiple plasma processes, all of the metal on surfaces having a slope angle of approximately 86° or greater is nitrided, thereby leaving no non-nitrided metal layer on those surfaces. A person having ordinary skill in the art will readily understand that different thicknesses of the nitrided metal layer and/or relations between different slope angles may be achieved by varying process parameters and/or thicknesses of, e.g., the as-deposited metal layer 300.

In operation 210, a silicide region is formed on the source/drain region by reacting the source/drain region with the non-nitrided metal layer. An example of operation 210 is illustrated in and described with respect to FIGS. 9A and 9B. For example, the silicide region 130 is formed on the epitaxial source/drain regions 60 by reacting the epitaxial source/drain regions 60 with the non-nitrided metal layer 100. As illustrated in the example of FIG. 15, non-nitrided portions of the as-deposited metal 300 (e.g., the region defined between intersecting boundaries 300, 302, and 304) are available for reacting with a source/drain region to form a silicide region.

In operation 212, a conductive fill material is deposited in the opening filling the opening. An example of operation 212 is illustrated in and described with respect to FIGS. 10A and 10B. For example, conductive fill material 140 is deposited in the opening 92 filling the opening 92.

Some embodiments can achieve advantages. The silicide regions formed by some embodiments can have an increased area to reduce a contact resistance. The silicide regions can also have an increased thickness uniformity that can reduce the risk of junction spiking in the underlying source/drain region. Additionally, the occurrence of voids at or in the silicide can be reduced. Further, a barrier layer with good adhesion properties and able to prevent oxidation of the silicide region can be formed. Even further, larger processing windows can be created, which can increase product yield.

An embodiment is a method of semiconductor processing. A metal layer is deposited in an opening through one or more dielectric layers to a source/drain region on a substrate. The metal layer is along the source/drain region and along a sidewall of the one or more dielectric layers that at least partially defines the opening. The metal layer is nitrided, which includes performing a multiple plasma process that includes at least one directional-dependent plasma process to cause nitridation of a first portion of the metal layer along the sidewall of the one or more dielectric layers and partial nitridation of a second portion of the metal layer along the source/drain region. A portion of the metal layer remains un-nitrided by the multiple plasma process. A silicide region is formed, which includes reacting the un-nitrided portion of the metal layer with a portion of the source/drain region. A conductive material is disposed in the opening on the nitrided first portion of the metal layer and the nitrided second portion of the metal layer.

Another embodiment is a method of semiconductor processing. A metal layer is deposited in an opening through one or more dielectric layers to a source/drain region on a substrate. The metal layer is along a sidewall of the opening and along the source/drain region. A first portion of the metal layer and a second portion of the metal layer are nitrided. The nitriding includes performing a multiple plasma process. The first portion of the metal layer is along the sidewall of the opening, and the second portion of the metal layer is along the source/drain region. A third portion of the metal layer is disposed between the second portion of the metal layer and the source/drain region, and is not nitrided by the multiple plasma process. The multiple plasma process includes at least one directional-dependent plasma process. A silicide region is formed. The formation of the silicide region includes reacting the third portion of the metal layer with a portion of the source/drain region. A conductive material is formed in the opening on the nitrided first portion of the metal layer and the nitrided second portion of the metal layer.

Another embodiment is a structure. The structure includes a source/drain region in an active area of a substrate, a dielectric structure having a sidewall, and a conductive feature along the sidewall of the dielectric structure. Upper surfaces of the source/drain region have slope angles of respective tangents with respect to a major plane of the substrate of 40 degrees or more. The conductive feature includes a silicide region along the source/drain region, a barrier layer along the sidewall of the dielectric structure and along the silicide region, and a conductive material on the barrier layer. The silicide region extends along the upper surfaces of the source/drain region to which the conductive feature contacts and having slope angles of respective tangents with respect to the major plane of the substrate of 40 degrees or more. The silicide region is disposed between the source/drain region and the barrier layer.

A further embodiment is a method for semiconductor processing. An opening is formed through one or more dielectric layers to a semiconductor material. A metal layer is deposited in the opening. Thicknesses of the metal layer varying depending on an orientation of a respective supporting surface of the metal layer. The metal layer is exposed to a first nitrogen-containing plasma. The metal layer is exposed to a second nitrogen-containing plasma. The first nitrogen-containing plasma and the second nitrogen-containing plasma each convert at least a first portion of the metal layer to a metal nitride layer. The second nitrogen-containing plasma has a greater directional-dependency than the first nitrogen-containing plasma. A second portion of the metal layer is reacted to the semiconductor material to form a silicide region on the semiconductor material. The silicide region is disposed between the semiconductor material and the metal nitride layer. A conductive material is formed in the opening on the metal nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of semiconductor processing, the method comprising:
depositing a metal layer in an opening through one or more dielectric layers to a source/drain region on a substrate, the metal layer being along the source/drain region and along a sidewall of the one or more dielectric layers that at least partially defines the opening;

nitriding the metal layer comprising performing a multiple plasma process that includes at least one directional-dependent plasma process to cause nitridation of a first portion of the metal layer along the sidewall of the one or more dielectric layers and partial nitridation of a second portion of the metal layer along the source/drain region, wherein an un-nitridated portion of the metal layer remains un-nitridated by the multiple plasma process;

forming a silicide region comprising reacting the un-nitrided portion of the metal layer with a portion of the source/drain region; and disposing a conductive material in the opening on the nitrided first portion of the metal layer and the nitrided second portion of the metal layer.

2. The method of claim 1, wherein depositing the metal layer comprises using a directional-dependent deposition process.

3. The method of claim 1, wherein, as deposited, the metal layer has a first thickness along the sidewall of the one or more dielectric layers and a second thickness along the source/drain region, the second thickness being greater than the first thickness.

4. The method of claim 1, wherein performing the multiple plasma process comprises:
performing a first plasma process comprising using a first nitrogen-containing plasma; and
after performing the first plasma process, performing a second plasma process comprising using a second nitrogen-containing plasma, wherein a directional-dependency of the second plasma process is greater than a directional-dependency of the first plasma process.

5. The method of claim 1, wherein performing the multiple plasma process comprises:
performing a first plasma process comprising using a first nitrogen-containing plasma; and
after performing the first plasma process, performing a second plasma process comprising using a second nitrogen-containing plasma, wherein a pressure of the first plasma process is greater than a pressure of the second plasma process.

6. The method of claim 5, wherein performing the first plasma process comprises performing multiple cycles, wherein each cycle comprises:
exposing the metal layer to the first nitrogen-containing plasma for a first duration; and
removing exposure of the metal layer from the first nitrogen-containing plasma for a second duration.

7. The method of claim 1, wherein performing the multiple plasma process comprises:
performing a first plasma process comprising using a first nitrogen-containing plasma; and
after performing the first plasma process, performing a second plasma process comprising using a second nitrogen-containing plasma, wherein a density and an energy of the first plasma process is greater than a density and an energy of the second plasma process, respectively.

8. The method of claim 1, wherein depositing the metal layer, nitriding the metal layer, and forming the silicide region are performed in the absence of a fluid comprising carbon and in the absence of a fluid comprising fluorine.

9. A method for semiconductor processing, the method comprising:

forming an opening through one or more dielectric layers to a semiconductor material;

depositing a metal layer in the opening, thicknesses of the metal layer varying depending on an orientation of a respective supporting surface of the metal layer;

exposing the metal layer to a first nitrogen-containing plasma;

exposing the metal layer to a second nitrogen-containing plasma, the first nitrogen-containing plasma and the second nitrogen-containing plasma each converting at least a first portion of the metal layer to a metal nitride layer, the second nitrogen-containing plasma having a greater directional-dependency than the first nitrogen-containing plasma;

reacting a second portion of the metal layer to the semiconductor material to form a silicide region on the semiconductor material, the silicide region being disposed between the semiconductor material and the metal nitride layer; and forming a conductive material in the opening on the metal nitride layer.

10. The method of claim 9, wherein the metal nitride layer contacts a sidewall of the one or more dielectric layers.

11. The method of claim 9, wherein a pressure of the first nitrogen-containing plasma is greater than a pressure of the second nitrogen-containing plasma.

12. The method of claim 11, wherein exposing the metal layer to the first nitrogen-containing plasma comprises exposing the metal layer to the first nitrogen-containing plasma in multiple cycles, wherein each cycle comprises:
exposing the metal layer to the first nitrogen-containing plasma for a first duration; and
removing exposure of the metal layer from the first nitrogen-containing plasma for a second duration.

13. The method of claim 9, wherein a density of the first nitrogen-containing plasma is greater than a density of the second nitrogen-containing plasma.

14. The method of claim 9, wherein an energy of the first nitrogen-containing plasma is greater than an energy of the second nitrogen-containing plasma.

15. The method of claim 9, wherein depositing the metal layer, exposing the metal layer to the first nitrogen-containing plasma and the second nitrogen-containing plasma, and reacting the second portion of the metal layer to the semiconductor material do not include using a fluid comprising carbon and do not include using a fluid comprising fluorine.

16. A method for semiconductor processing, the method comprising:
forming a source/drain region;
forming one or more dielectric layers over the source/drain region;
forming an opening through the one or more dielectric layers, wherein the source/drain region is exposed in the opening;
depositing a metal layer along sidewalls and a bottom of the opening;
performing a first nitrogen-containing plasma process on the metal layer to form a first nitridated layer, a thickness of the first nitridated layer along sidewalls of the one or more dielectric layers being about the same as a thickness of the first nitridated layer along the bottom of the opening;
performing a second nitrogen-containing plasma process on the metal layer to form a second nitridated layer, a thickness of the second nitridated layer along the sidewalls of the one or more dielectric layers being less than a thickness of the second nitridated layer along the bottom of the opening;

forming a metal silicide region by reacting at least a portion of the metal layer with the source/drain region, wherein the silicide region is disposed between the remaining portions of the source/drain region and the second nitridated layer; and forming a conductive material in the opening on the second nitridated layer.

17. The method of claim 16, wherein performing the first nitrogen-containing plasma process comprises performing a plurality of cycles, wherein each cycle comprises:

performing a plasma on step by exposing the metal layer to the first nitrogen-containing plasma for a first duration; and performing a plasma off step by removing the plasma from the metal layer.

18. The method of claim 16, wherein an entirety of the metal layer on the source/drain region is nitridated or silicided.

19. The method of claim 16, wherein an entirety of the metal layer along sidewalls of the one or more dielectric layers is nitridated.

20. The method of claim 16, wherein the metal silicide region directly contacts at least one of the one or more dielectric layers.

* * * * *